(12) United States Patent
Chang et al.

(10) Patent No.: US 10,313,981 B2
(45) Date of Patent: Jun. 4, 2019

(54) GAIN ADJUSTMENT METHOD FOR WIRELESS COMMUNICATION

(71) Applicant: REALTEK SEMICONDUCTOR CORP., Hsinchu (TW)

(72) Inventors: Wei-Hsuan Chang, Hsinchu (TW);
Shen-Chung Lee, Taoyuan (TW);
Chi-Fang Chang, Hsinchu (TW);
Yu-Nan Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/942,955

(22) Filed: Apr. 2, 2018

(65) Prior Publication Data

US 2018/0324709 A1 Nov. 8, 2018

(30) Foreign Application Priority Data

May 8, 2017 (TW) .............................. 106115084 A

(51) Int. Cl.
*H03G 3/20* (2006.01)
*H04B 1/30* (2006.01)
(Continued)

(52) U.S. Cl.
CPC .............. *H04W 52/24* (2013.01); *H03G 3/20* (2013.01); *H04B 1/30* (2013.01); *H04B 1/38* (2013.01); *H04W 52/52* (2013.01); *H04W 84/12* (2013.01)

(58) Field of Classification Search
CPC ..... H04W 52/24; H04W 52/52; H04W 84/12; H04B 1/38
See application file for complete search history.

(56) References Cited

U.S. PATENT DOCUMENTS

2006/0246895 A1* 11/2006 Ryu ...................... H04W 48/20
455/434
2009/0221252 A1* 9/2009 Cheung ................ H03G 3/3078
455/234.1
(Continued)

OTHER PUBLICATIONS

OA letter of counterpart TW application No. 106115084 dated Dec. 14, 2018. Summary of the OA letter: Claim 1 is rejected as being unpatentable over the cited references 1-2. Claims 2-3 are rejected as being unpatentable over the cited references 1-3. Claims 4-8, 10 are rejected as being unpatentable over the cited references 1-2, 4.

*Primary Examiner* — Nguyen T Vo
(74) *Attorney, Agent, or Firm* — WPAT, PC

(57) ABSTRACT

The present invention discloses a gain adjustment method for wireless communication. This method is carried out by a wireless transceiver, and an embodiment of the method comprises the following steps: obtaining at least one transceiving parameter of a wireless connection partner; determining an adaptive power gain according to the at least one transceiving parameter; having an idle power gain of a radio-frequency circuit of the wireless transceiver be the adaptive power gain for a period of time, or having the idle power gain of the radio-frequency circuit be the adaptive power gain until packet transmission operation or packet reception operation takes place within the period of time; and if none of the packet transmission operation and the packet reception operation takes place within the period of time, having the idle power gain of the radio-frequency circuit be an initial power gain right after the period of time.

20 Claims, 4 Drawing Sheets

(51) Int. Cl.
*H04B 1/38* (2015.01)
*H04W 52/24* (2009.01)
*H04W 52/52* (2009.01)
*H04W 84/12* (2009.01)

(56) References Cited

U.S. PATENT DOCUMENTS

2010/0067624 A1    3/2010   Sankabathula et al.
2013/0176864 A1    7/2013   Quan et al.
2013/0260809 A1   10/2013   Nentwig
2016/0316490 A1   10/2016   Wang et al.

\* cited by examiner

GAIN ADJUSTMENT METHOD FOR WIRELESS COMMUNICATION

BACKGROUND OF THE INVENTION

1. Field of the Invention

The present invention relates to a gain adjustment method, especially to a gain adjustment method for wireless communication.

2. Description of Related Art

Regarding the design of packet format for wireless communication, in order to achieve the purposes of packet detection, signal synchronization, channel detection, etc., a preamble is added in the front of a packet. In a procedure of a receiver demodulating a packet, once the receiver detects a field of the packet being illegal or detects cyclic redundancy check (CRC) error, parity check error, etc., the receiver takes the packet to be an unwanted packet and treats the packet as a false alarm; in the meantime, the receiver stops demodulating the packet and waits for a next packet.

In a current wireless local area network (WLAN) system, the frequency band of which the WLAN system makes use is vulnerable to interferences. Such interferences may lead to bad reception. Some interference has apparent feature(s) that is/are easily to be detected and removed, and this kind of interference won't affect the detection of a normal packet. However, some interference is similar to a packet preamble of WLAN, and this kind of interference will cause a wireless receiver to misjudge and confront a false alarm. In consideration of the above, a current art has a wireless receiver adjust an initial power gain of its radio-frequency circuit, so as to prevent the occurrence of a false alarm. The current art lowers the initial power gain of the radio-frequency circuit, and thereby prevents the wireless receiver from reacting to most interferences or being too sensitive; unfortunately, this manner may cause the wireless receiver to be hard to detect a normal packet or receive a normal packet smoothly.

SUMMARY OF THE INVENTION

An object of the present invention is to provide a gain adjustment method for wireless communication, and the gain adjustment method is an improvement over the prior art.

The present invention discloses a gain adjustment method for wireless communication. The gain adjustment method is carried out by a wireless transceiver, and an embodiment of the method comprises the following steps: obtaining at least one transceiving parameter of a wireless connection partner; determining an adaptive power gain according to the at least one transceiving parameter; having an idle power gain of a radio-frequency circuit of the wireless transceiver be the adaptive power gain for a period of time; and having the idle power gain of the radio-frequency circuit be an initial power gain right after the period of time.

Another embodiment of the aforementioned method comprises the following steps: obtaining at least one transceiving parameter of a wireless connection partner; determining an adaptive power gain according to the at least one transceiving parameter; having an idle power gain of a radio-frequency circuit of the wireless transceiver be the adaptive power gain for a period of time, or having the idle power gain be the adaptive power gain until the wireless transceiver carries out packet transmission operation or packet reception operation within the period of time; if the packet transmission operation or the packet reception operation takes place within the period of time, performing automatic gain control over the radio-frequency circuit; and if none of the packet transmission operation and the packet reception operation takes place within the period of time, having the idle power gain of the radio-frequency circuit be an initial power gain right after the period of time.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in this specification, such term should be explained accordingly.

The present invention anticipates a subsequent packet from a connection partner after a preceding packet was transmitted or received. Therefore, after the preceding packet was transmitted or received, the present invention adaptively adjust a power gain of a radio-frequency circuit of a wireless transceiver, so as to allow the wireless transceiver to receive signals from the connection partner smoothly. In addition, the present invention can set the power gain according to the difference between a signal of the connection partner and an interference signal, so as to restrain interference and lower the occurrence rate of false alarms.

Figure 1:
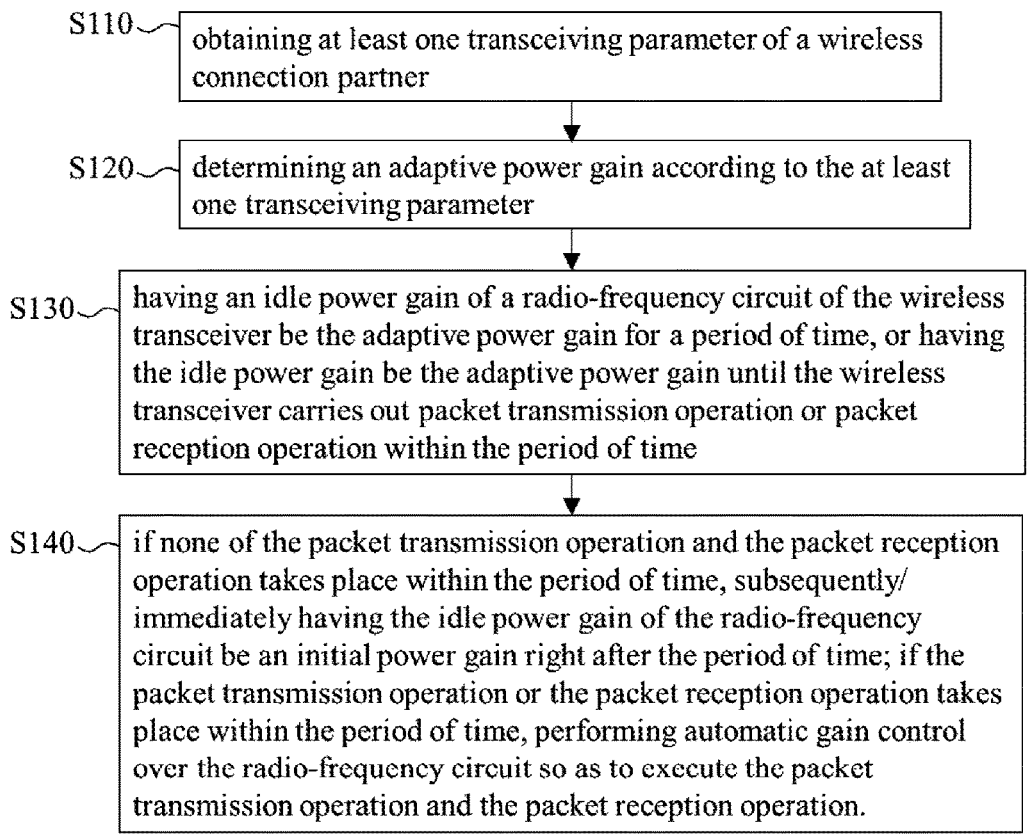
FIG. 1 shows the gain adjustment method for wireless communication according to an embodiment of the present invention.

FIG. 1 shows the gain adjustment method for wireless communication according to an embodiment of the present invention. The embodiment of FIG. 1 is carried out by a wireless transceiver which operates in compliance with an IEEE 802.11 standard. An instance of the wireless transceiver is a wireless access point or the equivalent thereof; of course, the wireless transceiver can be a device in compliance with another wireless communication standard if such device is practicable for implementing the present invention. The embodiment of FIG. 1 includes the following steps:

Step S110: obtaining at least one transceiving parameter of a wireless connection partner (e.g., a cell phone or a computer).

For instance, at a time not later than the aforementioned wireless transceiver "transmitting" a packet to the wireless connection partner, the wireless transceiver obtains at least one of the following parameters of the wireless connection partner based on earlier transmission operation and/or reception operation: a received signal strength indicator (RSSI) or an equivalent thereof; a signal-to-noise ratio (SNR) or an equivalent thereof; a transmission distance or an equivalent thereof; a transmission speed or an equivalent thereof;

a data error rate or an equivalent thereof; a retransmission count or an equivalent thereof; and a type of modulation and coding scheme (MCS) or an equivalent thereof. Each of the above-mentioned parameters relates to a reception power gain (e.g., the adaptive power gain described in the later paragraphs). Generally, the reception power gain that is associated with the parameters will be lower provided that a signal strength of the wireless connection partner is stronger, an SNR is higher, the transmission distance is shorter, the data error rate is lower, the retransmission count is fewer, or the wireless transceiver is more sensitive to a reception signal of a specific MCS.

For another instance, after the wireless transceiver "receiving" a packet form the wireless connection partner, the wireless transceiver generates the at least one transceiving parameter according to an automatic gain control result of receiving the packet.

Step S120: determining an adaptive power gain according to the at least one transceiving parameter.

For instance, after the wireless transceiver determines a minimum power gain, a maximum power gain, or a region of power gain for adaptively receiving packets of the wireless connection partner according to the at least one transceiving parameter, the wireless transceiver has the adaptive power gain be not less than the minimum power gain, not greater than the maximum power gain, or in the region of power gain.

Step S130: having an idle power gain of a radio-frequency circuit of the wireless transceiver be the adaptive power gain for a period of time, or having the idle power gain be the adaptive power gain until the wireless transceiver carries out packet transmission operation or packet reception operation within the period of time.

For instance, after the wireless transceiver "transmitting" a packet to the wireless connection partner, the wireless transceiver has the idle power gain be the adaptive power gain for a first period of time subsequently/immediately, and if the wireless transceiver carries out packet transmission/reception operation within the first period of time, an automatic gain control function of the wireless transceiver takes over the setting of the power gain of the radio-frequency circuit.

For another instance, after the wireless transceiver "receiving" a packet from the wireless connection partner, the wireless transceiver has the idle power gain be the adaptive power gain for a second period of time subsequently/immediately, and if the wireless transceiver carries out packet transmission/reception within the second period of time, the automatic gain control function of the wireless transceiver takes over the setting of the power gain of the radio-frequency circuit. The second period of time can be equal to or different from the aforementioned first period of time.

Step S140: if none of the packet transmission operation and the packet reception operation takes place within the period of time, subsequently/immediately having the idle power gain of the radio-frequency circuit be an initial power gain when running out of the period of time (i.e., right after the period of time); if the packet transmission operation or the packet reception operation takes place within the period of time, performing automatic gain control over the radio-frequency circuit so as to execute the packet transmission operation and the packet reception operation.

Generally, the initial power gain is suitable for receiving packets from different wireless devices including the wireless connection partner, and the adaptive power gain is suitable for/dedicated to receiving packets from the wireless connection partner. Since the two kinds of power gain aim at different purposes, the two gains are usually different.

Figure 2:
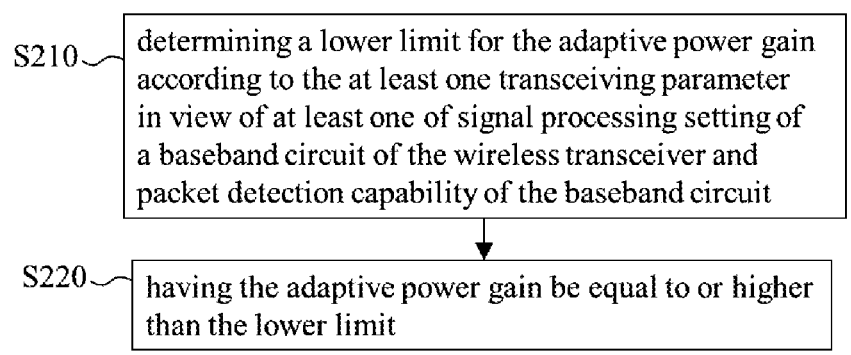
FIG. 2 shows an embodiment of step S120 of FIG. 1.

In an embodiment, in order to receive packets of the wireless connection partner for sure, the step S120 of FIG. 1 optionally includes the following steps as shown in FIG. 2:

Step S210: determining a lower limit for the adaptive power gain according to the at least one transceiving parameter in view of at least one of signal processing setting of a baseband circuit of the wireless transceiver and packet detection capability of the baseband circuit.

For instance, providing the at least one transceiving parameter indicates that the signal strength of the wireless connection partner detected by the wireless transceiver is −60 dBmW, the signal processing setting of the baseband circuit allows the baseband circuit to process signals of 0 dBmW, and the packet detection capability of the baseband circuit is 10 dB, in order to receive a packet subsequently transmitted by the wireless connection partner, the lower limit for the adaptive power gain is derived from the follows: "the signal processing setting=the signal strength of the wireless connection partner+the packet detection capability+the lower limit for the adaptive power gain (i.e., 0=−60+10+the lower limit for the adaptive power gain)". Accordingly, the lower limit for the adaptive power gain should be 50 dB.

Step S220: having the adaptive power gain be equal to or higher than the lower limit.

For instance, the wireless transceiver selects one of a plurality of predetermined power gains as the adaptive power gain. The selected predetermined power gain is not less than the lower limit, so as to surely receive packets of the wireless connection partner.

Figure 3:
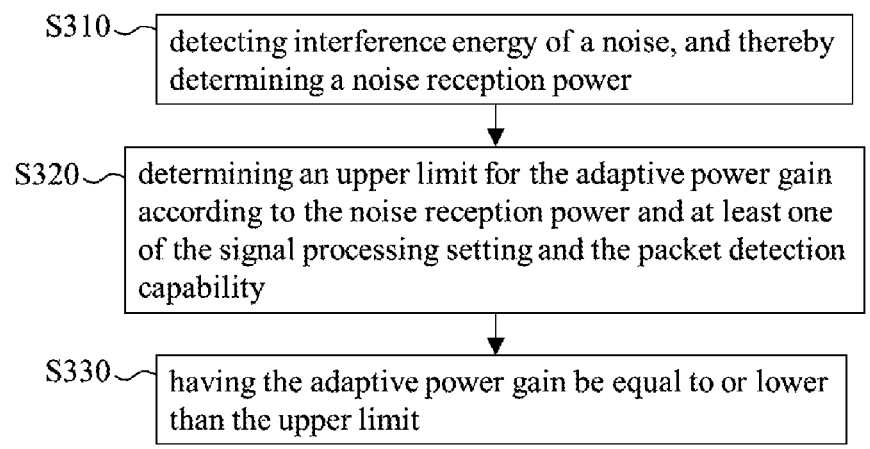
FIG. 3 shows another embodiment of step S120 of FIG. 1.

In an embodiment, in order to exclude severe interference in the communication environment, the step S120 of FIG. 1 optionally includes the following steps as shown in FIG. 3:

Step S310: detecting interference energy of a noise, and thereby determining a noise reception power.

For instance, the wireless transceiver determines the interference energy of the noise according to the information of a noise which causes a false alarm previously, and thereby determines the noise reception power.

Step S320: determining an upper limit for the adaptive power gain according to the noise reception power and at least one of the signal processing setting and the packet detection capability.

For instance, providing the signal processing setting of the baseband circuit allows the baseband circuit to process signals of 0 dBmW, the packet detection capability of the baseband circuit is 10 dB, and the noise reception power is −75 dBmW, in order to prevent the noise from causing a false alarm, the upper limit for the adaptive power gain is derived from the follows: "the signal processing setting=the noise reception power+the packet detection capability+the upper limit for the adaptive power gain (i.e., 0=−75+10+the upper limit for the adaptive power gain)". Accordingly, the upper limit for the adaptive power gain should be 65 dB.

Step S330: having the adaptive power gain be equal to or lower than the upper limit.

For instance, when the lower limit and the upper limit for the adaptive power gain are 50 dB and 65 dB respectively, the wireless transceiver selects one of a plurality of predetermined power gains as the adaptive power gain. The selected predetermined power gain is between the upper limit and the lower limit, so that the wireless transceiver can safely receive packets of the wireless connection partner and exclude the noise. It should be noted that if the lower limit is found higher than the upper limit, the adaptive power gain will be forced to be not greater than the lower limit in this instance.

For another instance, when the lower limit is not yet determined but the upper limit has been determined to be 65 dB, the wireless transceiver selects one of a plurality of predetermined power gains as the adaptive power gain. The selected predetermined power gain is not greater than the upper limit, so as to avoid receiving the noise.

Figure 4:
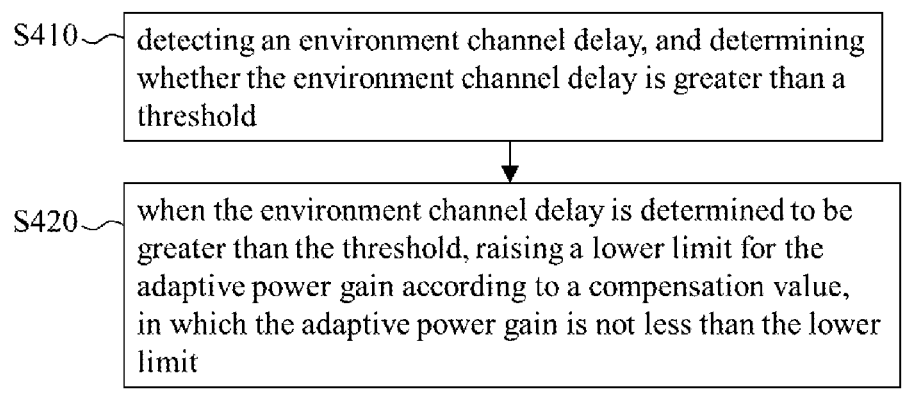
FIG. 4 shows a further embodiment of step S120 of FIG. 1.

In an embodiment, in order to resist channel fading caused by channel delay, the step S120 of FIG. 1 optionally includes the following steps as shown in FIG. 4:

Step S410: detecting an environment channel delay, and determining whether the environment channel delay is greater than a threshold.

Step S420: when the environment channel delay is determined to be greater than the threshold, raising a lower limit for the adaptive power gain according to a compensation value, in which the adaptive power gain is not less than the lower limit.

For instance, the original lower limit was the lower limit determined in the aforementioned step S210; through step S420, the lower limit is raised to be the original lower limit (e.g., 50 dB) plus the compensation value (e.g., 5 dB).

It is mentioned in the preceding paragraph that the type of MCS can be the transceiving parameter. In detail, if the sensitivity of the wireless transceiver receiving a packet of MCS-9 is −60 dBmW, the sensitivity of the wireless transceiver receiving a packet of MCS-8 is −65 dBmW, and the wireless transceiver can only receive a packet of MCS-8 from the wireless connection partner without successfully receiving a packet of MCS-9 from the wireless connection partner, the wireless transceiver can estimate that the signal strength of the packet of MCS-8 is within (−63±2) dBmW according to the above information. Therefore, providing the signal processing setting of the aforementioned baseband circuit allows the baseband circuit to process signals of 0 dBmW and the packet detection capability of the baseband circuit is 10 dB, in order to receive the packet of MCS-8, the lower limit for the adaptive power gain is derived from the follows: "the signal processing setting=the signal strength of the packet of MCS-8+the packet detection capability+the lower limit for the adaptive power gain (i.e., 0=−63+10+the lower limit for the adaptive power gain)". Accordingly, the lower limit for the adaptive power gain should be 53 dB. As to the upper limit for the adaptive power gain, it can be the lower limit plus a predetermined value, or it is determined by the strength of interference as described in the preceding paragraph. It should be noted that MCS-8 and MCS-9 are well-known modulation types in this industrial field, and their detail is omitted here.

It should be noted that if an implementation derived from one or more of the aforementioned embodiments is practicable, a person of ordinary skill in the art can selectively make use of some or all of the features in one embodiment or selectively make use of the combination of some or all features in several embodiments to have the implementation come true, and this increases the flexibility of carrying out the present invention. It should be also noted that the method of the present invention can be carried out by an existing wireless transceiver without specific hardware modification.

To sum up, the present invention anticipates a following packet from a connection partner after a preceding packet was transmitted to or received from the connection partner, and accordingly adjust an idle power gain of a radio-frequency circuit of a wireless transceiver to be an adaptive power gain which allows the wireless transceiver to receive the following packet from the connection partner correctly and reduce the occurrence rate of false alarms. After a period of time without receiving or transmitting any packet, the present invention restores the idle power gain of the radio-frequency circuit to an initial power gain.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A gain adjustment method for wireless communication, the gain adjustment method being carried out by a wireless transceiver and comprising:
   obtaining at least one transceiving parameter of a wireless connection partner;
   determining an adaptive power gain according to the at least one transceiving parameter, in which the adaptive power gain is workable for the wireless transceiver receiving packets from the wireless connection partner;
   having an idle power gain of a radio-frequency circuit of the wireless transceiver be the adaptive power gain for a period of time, in which the idle power gain is for the wireless transceiver waiting for packet transmission or packet reception in the period of time; and
   having the idle power gain of the radio-frequency circuit be an initial power gain right after the period of time, in which the initial power gain is workable for the wireless transceiver receiving packets from different wireless devices including the wireless connection partner.

2. The gain adjustment method for wireless communication of claim 1, wherein the step of having the idle power gain be the adaptive power gain includes:
   transmitting a packet to the wireless connection partner; and
   after the packet is transmitted, having the idle power gain be the adaptive power gain, in which the at least one transceiving parameter includes at least one of follows: a received signal strength indicator (RSSI); a signal-to-noise ratio (SNR); a transmission distance; a transmission speed; a data error rate; a retransmission count; and a type of modulation and coding scheme (MCS).

3. The gain adjustment method for wireless communication of claim 2, wherein the step of determining the adaptive power gain includes:
   determining a lower limit for the adaptive power gain according to the at least one transceiving parameter in view of at least one of signal processing setting of a baseband circuit and packet detection capability of the baseband circuit, in which the signal processing setting allows the baseband circuit to process signals of 0 dBmW; and
   having the adaptive power gain be equal to or higher than the lower limit.

4. The gain adjustment method for wireless communication of claim 3, wherein the step of determining the adaptive power gain further includes:
  detecting interference energy of a noise, and thereby determining a noise reception power;
  determining an upper limit for the adaptive power gain according to the noise reception power and at least one of the signal processing setting and the packet detection capability; and
  when the upper limit is not lower than the lower limit, having the adaptive power gain be equal to or lower than the upper limit.

5. The gain adjustment method for wireless communication of claim 2, wherein the step of determining the adaptive power gain includes:
  detecting interference energy of a noise, and thereby determining a noise reception power;
  determining an upper limit for the adaptive power gain according to the noise reception power in view of at least one of signal processing setting of a baseband circuit and packet detection capability of the baseband circuit, in which the signal processing setting allows the baseband circuit to process signals of 0 dBmW; and
  having the adaptive power gain be equal to or lower than the upper limit.

6. The gain adjustment method for wireless communication of claim 1, wherein the step of determining the adaptive power gain includes:
  detecting an environment channel delay, and determining whether the environment channel delay is greater than a threshold, in which the environment channel delay refers to a channel between the wireless transceiver and the wireless connection partner; and
  when the environment channel delay is determined to be greater than the threshold, raising a lower limit for the adaptive power gain according to a compensation value, in which the adaptive power gain is not less than the lower limit.

7. The gain adjustment method for wireless communication of claim 1, wherein the step of obtaining the at least one transceiving parameter includes:
  receiving a packet of the wireless connection partner; and
  generating the at least one transceiving parameter according to an automatic gain control result of receiving the packet.

8. The gain adjustment method for wireless communication of claim 7, wherein the step of determining the adaptive power gain includes:
  determining a lower limit for the adaptive power gain according to the at least one transceiving parameter in view of at least one of signal processing setting of a baseband circuit and packet detection capability of the baseband circuit, in which the signal processing setting allows the baseband circuit to process signals of 0 dBmW; and
  having the adaptive power gain be equal to or higher than the lower limit.

9. The gain adjustment method for wireless communication of claim 8, wherein the step of determining the adaptive power gain further includes:
  detecting interference energy of a noise, and thereby determining a noise reception power;
  determining an upper limit for the adaptive power gain according to the noise reception power and at least one of the signal processing setting and the packet detection capability; and
  when the upper limit is not lower than the lower limit, having the adaptive power gain be equal to or lower than the upper limit.

10. The gain adjustment method for wireless communication of claim 7, wherein the step of determining the adaptive power gain further includes:
  detecting interference energy of a noise, and thereby determining a noise reception power;
  determining an upper limit for the adaptive power gain according to the noise reception power in view of at least one of signal processing setting of a baseband circuit and packet detection capability of the baseband circuit, in which the signal processing setting allows the baseband circuit to process signals of 0 dBmW; and
  having the adaptive power gain be equal to or lower than the upper limit.

11. The gain adjustment method for wireless communication of claim 1, wherein the wireless transceiver operates in compliance with an IEEE 802.11 standard.

12. A gain adjustment method for wireless communication, the gain adjustment method being carried out by a wireless transceiver and comprising:
  obtaining at least one transceiving parameter of a wireless connection partner;
  determining an adaptive power gain according to the at least one transceiving parameter, in which the adaptive power gain is workable for the wireless transceiver receiving packets from the wireless connection partner;
  having an idle power gain of a radio-frequency circuit of the wireless transceiver be the adaptive power gain for a period of time, or having the idle power gain be the adaptive power gain until the wireless transceiver carries out packet transmission operation or packet reception operation within the period of time, in which the idle power gain is for the wireless transceiver waiting for packet transmission or packet reception in the period of time;
  on condition that the packet transmission operation or the packet reception operation takes place within the period of time, performing automatic gain control over the radio-frequency circuit; and
  on condition that none of the packet transmission operation and the packet reception operation takes place within the period of time, having the idle power gain of the radio-frequency circuit be an initial power gain right after the period of time, in which the initial power gain is workable for the wireless transceiver receiving packets from different wireless devices including the wireless connection partner.

13. The gain adjustment method for wireless communication of claim 12, wherein the step of having the idle power gain be the adaptive power gain includes:
  transmitting a packet to the wireless connection partner; and
  after the packet is transmitted, having the idle power gain be the adaptive power gain, in which the at least one transceiving parameter includes at least one of follows: a received signal strength indicator (RSSI); a signal-to-noise ratio (SNR); a transmission distance; a transmission speed; a data error rate; a retransmission count; and a type of modulation and coding scheme (MCS).

14. The gain adjustment method for wireless communication of claim 13, wherein the step of determining the adaptive power gain includes:
  determining a lower limit for the adaptive power gain according to the at least one transceiving parameter and according to at least one of signal processing setting of a baseband circuit and packet detection capability of the baseband circuit, in which the signal processing setting allows the baseband circuit to process signals of 0 dBmW; and having the adaptive power gain be equal to or higher than the lower limit.

15. The gain adjustment method for wireless communication of claim 13, wherein the step of determining the adaptive power gain includes:

detecting interference energy of a noise, and thereby determining a noise reception power;

determining an upper limit for the adaptive power gain according to the noise reception power in view of at least one of signal processing setting of a baseband circuit and packet detection capability of the baseband circuit, in which the signal processing setting allows the baseband circuit to process signals of 0 dBmW; and having the adaptive power gain be equal to or lower than the upper limit.

16. The gain adjustment method for wireless communication of claim 12, wherein the step of obtaining the at least one transceiving parameter includes:

receiving a packet of the wireless connection partner; and generating the at least one transceiving parameter according to an automatic gain control result of receiving the packet.

17. The gain adjustment method for wireless communication of claim 16, wherein the step of determining the adaptive power gain includes:

determining a lower limit for the adaptive power gain according to the at least one transceiving parameter in view of at least one of signal processing setting of a baseband circuit and packet detection capability of the baseband circuit, in which the signal processing setting allows the baseband circuit to process signals of 0 dBmW; and having the adaptive power gain be equal to or higher than the lower limit.

18. The gain adjustment method for wireless communication of claim 16, wherein the step of determining the adaptive power gain includes:

detecting interference energy of a noise, and thereby determining a noise reception power;

determining an upper limit for the adaptive power gain according to the noise reception power in view of at least one of signal processing setting of a baseband circuit and packet detection capability of the baseband circuit, in which the signal processing setting allows the baseband circuit to process signals of 0 dBmW; and having the adaptive power gain be equal to or lower than the upper limit.

19. The gain adjustment method for wireless communication of claim 12, wherein the step of determining the adaptive power gain includes:

detecting an environment channel delay, and determining whether the environment channel delay is greater than a threshold, in which the environment channel delay refers to a channel between the wireless transceiver and the wireless connection partner; and when the environment channel delay is determined to be greater than the threshold, raising a lower limit for the adaptive power gain according to a compensation value, in which the adaptive power gain is not less than the lower limit.

20. The gain adjustment method for wireless communication of claim 12, wherein the wireless transceiver operates in compliance with an IEEE 802.11 standard.

* * * * *